(12) United States Patent
Starodoumov et al.

(10) Patent No.: US 7,212,553 B2
(45) Date of Patent: May 1, 2007

(54) WAVELENGTH STABILIZED DIODE-LASER ARRAY

(75) Inventors: Andrei Starodoumov, Cupertino, CA (US); Murray Keith Reed, Menlo Park, CA (US)

(73) Assignee: Coherent, Inc., Santa Clara, CA (US)

( * ) Notice: Subject to any disclaimer, the term of this patent is extended or adjusted under 35 U.S.C. 154(b) by 396 days.

(21) Appl. No.: 10/802,616

(22) Filed: Mar. 16, 2004

(65) Prior Publication Data

US 2005/0207454 A1 Sep. 22, 2005

(51) Int. Cl.
*H01S 3/10* (2006.01)

(52) U.S. Cl. .................. 372/4; 372/6; 385/37
(58) Field of Classification Search ............ 372/4, 372/5, 6, 99, 102; 385/37; 250/225
See application file for complete search history.

(56) References Cited

U.S. PATENT DOCUMENTS

| | | | | |
|---|---|---|---|---|
| 4,786,132 | A | 11/1988 | Gordon | 350/96.19 |
| 4,911,516 | A | 3/1990 | Palfrey et al. | 350/96.19 |
| 4,914,665 | A | 4/1990 | Sorin | 372/20 |
| 5,022,042 | A | 6/1991 | Bradley | 372/75 |
| 5,323,404 | A | 6/1994 | Grubb | 372/6 |
| 5,457,760 | A * | 10/1995 | Mizrahi | 385/37 |
| 5,485,481 | A | 1/1996 | Ventrudo et al. | 372/6 |
| 5,589,684 | A | 12/1996 | Ventrudo et al. | 250/225 |
| 5,715,263 | A | 2/1998 | Ventrudo et al. | 372/6 |
| 5,841,797 | A * | 11/1998 | Ventrudo et al. | 372/6 |
| 5,864,644 | A | 1/1999 | DiGiovanni et al. | 358/43 |
| 5,949,932 | A | 9/1999 | Lawrenz-Stolz | 385/33 |
| 6,041,072 | A * | 3/2000 | Ventrudo et al. | 372/102 |
| 6,044,093 | A | 3/2000 | Ventrudo et al. | 372/6 |

(Continued)

FOREIGN PATENT DOCUMENTS

EP 1 215 784 A2 6/2002

(Continued)

OTHER PUBLICATIONS

C.R. Giles et al., "Reflection-Induced Changes in the Optical Spectra of 980-nm QW Lasers," *IEEE Photonics Technology Letters*, vol. 6, No. 8, Aug. 1994, pp. 903-906.

(Continued)

*Primary Examiner*—Tuyet Vo
*Assistant Examiner*—Jimmy Vu
(74) *Attorney, Agent, or Firm*—Stallman & Pollock LLP

(57) ABSTRACT

A fiber laser including doped-core fiber having inner and outer cladding is optically pumped by plurality of diode-lasers. Light emitted by the diode-lasers is coupled into a single multimode optical fiber. Light from the multimode optical fiber is directed to a wavelength selective reflecting device that is partially reflective in a narrow reflection band about a peak reflection wavelength. A portion of the light having the peak reflection wavelength is reflected from the wavelength selective reflecting device back along the multimode optical fiber and back into the plurality of diode-lasers. This locks the emitting wavelength of the light emitted from each of the diode-lasers to the peak reflection wavelength. Light at the emitting wavelength that is not reflected from the wavelength selective reflective device is coupled into the inner cladding of the doped-core fiber for optically pumping the fiber laser.

22 Claims, 4 Drawing Sheets

U.S. PATENT DOCUMENTS 6,288,835 B1   9/2001   Nilsson et al. ............ 359/341.3

FOREIGN PATENT DOCUMENTS

WO        WO 99/37002      7/1999

OTHER PUBLICATIONS

L. Zhai et al., "Detuning Characteristics of Mode-locked Semiconductor Lasers with a Chirped Fibre-Grating External Cavity," *Instn. Radio & Electron. Eng. Australia, Edgecliff, NSW, Australia (Conference: Proceedings of the 18th Australian Conference on Optical Fibre Technology)*, Nov. 28 - Dec. 1, 1993, 21 pages in length.

S.L. Woodward et al., "Wavelength Stabilization of a DBR Laser Using an In-Fiber Bragg Filter," *IEEE Photonics Technology Letters*, vol. 5, No. 6, Jun. 1993, pp. 628-630.

G.M. Carter et al., "Compression of pulses from a mode locked GaAs laser diode in an extended cavity with a fiber grating reflector," *Applied Physics Letters*, vol. 61, No. 4, Jul. 27, 1992, pp. 379-380.

D.M. Bird et al., "Narrow Line Semiconductor Laser Using Fibre Grating," *Electronics Letters*, vol. 27. No. 13, Jun. 20, 1991, pp. 1115-1116.

W.V. Sorin et al., "Tunable Single-Mode Fiber Reflective Grating Filter," *Journal of Lightwave Technology*, vol. LT-5, No. 9, Sep. 1987, pp. 1119-1202.

W.V. Sorin et al., "Tunable Single-Mode Output of a Multimode Laser in a Tunable Fibre Grating External Cavity," *Electronics Letters*, vol. 23, No. 8, Apr. 9, 1987, pp. 390-391.

A.A. Tager et al., "Stability Regimes and High-Frequency Modulation of Laser Diodes with Short External Cavity," *IEEE Journal of Quantum Electronics*, vol. 29, No. 12, Dec. 1993, pp. 2886-2890.

G.L. Koay et al., "Effect of Optical Feedback on Short-Haul Lightwave Systems Using Fabry-Perot Lasers," *Instn. Radio & Electron. Eng. Australia, Edgecliff, NSW, Australia (Conference: Proceedings of the 18th Australian Conference on Optical Fibre Technology)*, Nov. 28 - Dec. 1, 1993, 4 pages in length.

J. Sigg, "Effects of Optical Feedback on the Light-Current Characteristics of Semiconductor Lasers," *IEEE Journal of Quantum Electronics*, vol. 29, No. 5, May 1993, pp. 1262-1270.

S.L. Woodward et al., "The Onset of Coherence Collapse in DFB Lasers," *IEEE Photonics Technology Letters*, vol. 4, No. 3, Mar. 1992, pp. 221-223.

J. Mørk et al., "Chaos in Semiconductor Lasers with Optical Feedback: Theory and Experiment," *IEEE Journal of Quantum Electronics*, vol. 28, No. 1, Jan. 1992, pp. 93-108.

D.M. Byrne et al., "Optical Feedback-Induced Noise in Pigtailed Laser Diode Modules," *IEEE Photonics Technology Letters*, vol. 3, No. 10, Oct. 1991, pp. 891-894.

J.S. Cohen et al., "The Critical Amount of Optical Feedback for Coherence Collapse in Semiconductor Lasers," *IEEE Journal of Quantum Electronics*, vol. 27, No. 1, Jan. 1991, pp. 10-12.

B. Tromborg et al., "Stability Analysis and the Route to Chaos for Laser Diodes with Optical Feedback," *IEEE Photonics Technology Letters*, vol. 2, No. 8, Aug. 1990, pp. 549-552.

J.O. Binder et al., "Mode Selection and Stability of a Semiconductor Laser with Weak Optical Feedback," *IEEE Journal of Quantum Electronics*, Vol. 25, No. 11, Nov. 1989, pp. 2255-2259.

N. Schunk et al., "Stability Analysis for Laser Diodes with Short External Cavities," *IEEE Photonics Technology Letters*, vol. 1, No. 3, Mar. 1989, pp. 49-51.

K. Petermann et al., "Laser diode characteristics with external optical feedback," *Fourteenth European Conference on Optical Communication (ECOC 88)*, Sep. 11-15, 1988, 20 pages in length.

N. Schunk et al., "Measured Feedback-Induced Intensity Noise for 1-3μm DFB Laser Diodes," *Electronics Letters*, vol. 25, No. 1, Jan. 5, 1989, pp. 63-64.

N. Schunk et al., "Numerical Analysis of the Feedback Regimes for a Single-Mode Semiconductor Laser with External Feedback," *IEEE Journal of Quantum Electronics*, vol. 24, No. 7, Jun. 1988, pp. 1242-1247.

B.H. Verbeek, "Coherence Properties and L.F. Noise in AlGaAs Lasers with Optical Feedback," *SPIE-The International Society for Optical Engineering, Proceedings vol. 587 Optical Fiber Sources and Detectors*, Nov. 28-29, 1985, pp. 93-98.

C.H. Henry, "Phase Noise in Semiconductor Lasers," *Journal of Lightwave Technology*, vol. LT-4, No. 3, Mar. 1986, pp. 298-311.

D. Lenstra et al., "Coherence Collapse in Single-Mode Semiconductor Lasers Due to Optical Feedback," *IEEE Journal of Quantum Electronics*, vol. QE-21, No. 6, Jun. 1985, pp. 674-679.

C.R. Giles et al., "Simultaneous Wavelength-Stabilization of 980-nm Pump Lasers," *IEEE Photonics Technology Letters*, vol. 6, No. 8, Aug. 1994, pp. 907-909.

\* cited by examiner

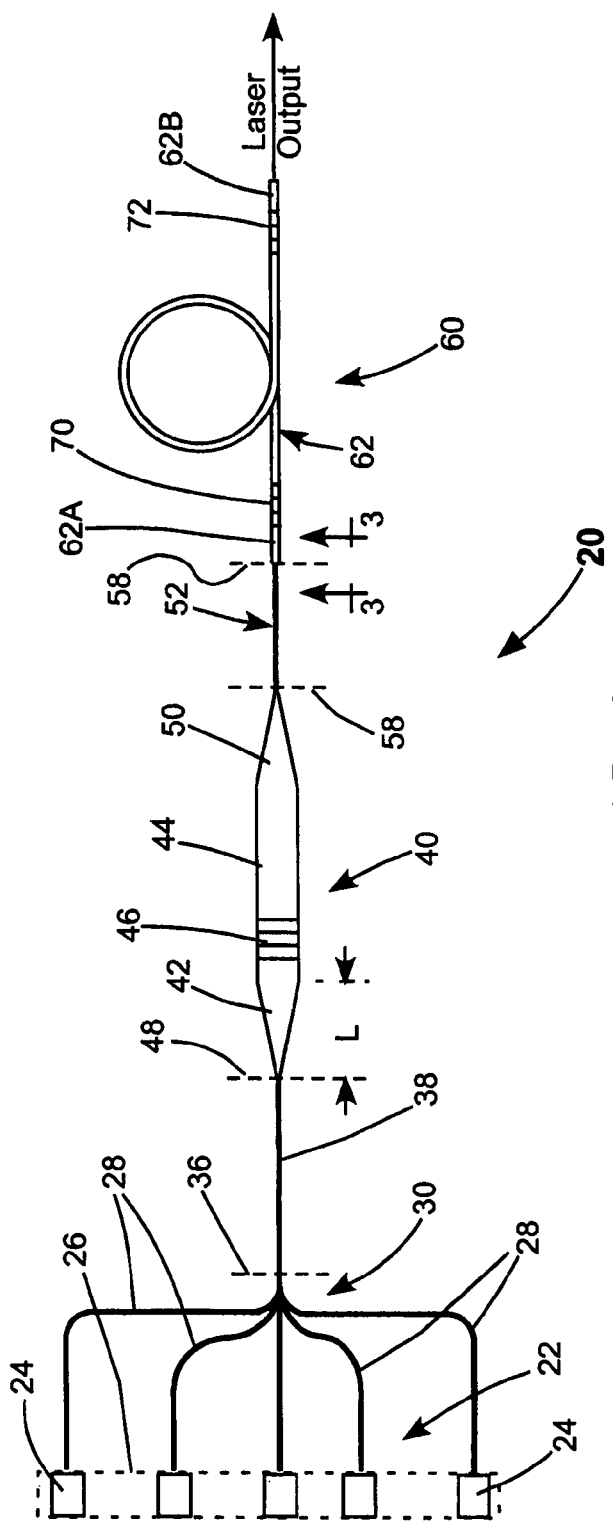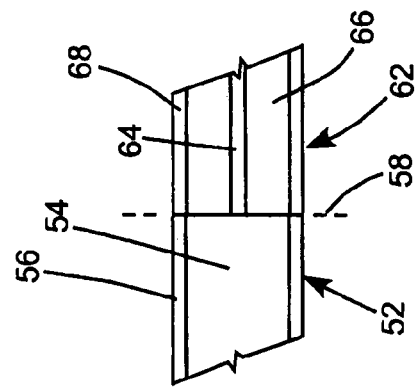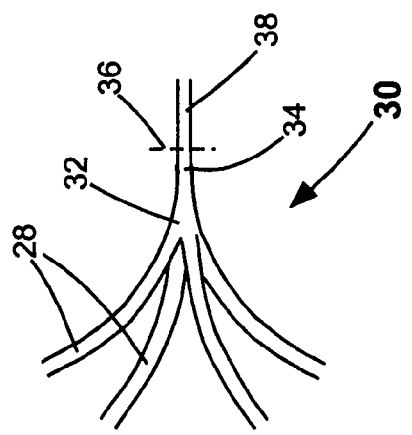

WAVELENGTH STABILIZED DIODE-LASER ARRAY

TECHNICAL FIELD OF THE INVENTION

The present invention relates generally to cladding-pumped fiber-lasers. The invention relates in particular to a fiber-laser, cladding pumped by multiple diode-laser emitters that are wavelength locked by a common wavelength-locking device.

DISCUSSION OF BACKGROUND ART

Fiber-lasers are commonly pumped by light from a diode-laser. One preferred fiber-laser type that is suitable for diode-laser pumping is referred to by practitioners of the art as a double-clad fiber-laser or a cladding pumped fiber-laser. The double clad fiber-laser has a doped core that provides optical gain when energized by the pump light from the diode-laser. Surrounding the doped core is an inner cladding and surrounding the inner cladding is an outer cladding. The diode-laser light (pump light) is directed into the inner cladding of the fiber-laser and propagates through the inner cladding while being progressively absorbed in the doped core, thereby energizing (pumping) the core.

If a fiber-laser is required to provide a high power output, for example, greater than about 3.0 Watts (W), a single diode-laser emitter may not be capable of providing sufficient pump light power. It this case, it will be necessary to provide pump-light from a plurality of emitters. It is usually found convenient to provide an integrated linear array of such emitters or diode-lasers in what is termed a "diode-laser bar" by practitioners of the art. The emitters in the bar are preferably multimode emitters.

A multimode emitter usually has a higher power output than single mode emitter of the same length and heterostructure. The output power and the number of emitted lateral (spatial) modes of such an emitter usually increases as the width of the emitter increases. By way of example, a multimode emitter having an emitter width of 100 micrometers ($\mu m$) can emit as much as twenty or more times the power of a corresponding single mode emitter having a width of between 1 $\mu m$ and 5 $\mu m$. In a common pumping arrangement, multimode radiation from a laser emitter is coupled into a multimode optical fiber. Light from the multimode optical fiber is, in turn, coupled to the fiber-laser.

Optimum absorption of pump light in a doped fiber core usually occurs in a relatively narrow band of wavelengths. By way of example, in a ytterbium (Yb) doped core, there is a strong absorption peak at a wavelength of about 977 nanometers (nm). The absorption peak has a full width at 90% maximum absorption (FWNM) of only about 1.0 nm. A diode-laser having a peak gain at 977 nm has a gain bandwidth of between about 4 and 6 nm. Accordingly, it is desirable that pump light have a wavelength equal to the peak absorption wavelength and have a bandwidth about equal to the peak absorption bandwidth.

In a diode-laser bar, lasing wavelengths of individual diode-lasers or emitters may be spread over a range of a few nanometers. Further, the individual emitters in the bar will exhibit a strong, temperature-induced wavelength shift. By way of example, for emitters nominally lasing at a wavelength of 977 nm, the wavelength variation with temperature change is about 0.3 nm per degree Kelvin (0.3 nm/° K). This relatively high temperature sensitivity, combined with the range of emitting wavelengths, makes a multimode diode-laser bar unsuitable for pumping a fiber-laser lasers wherein pump light must be absorbed in a narrow band of wavelengths. To provide an efficient absorption of pump light in a doped fiber core having a narrow absorption peak, wavelength locking or wavelength stabilization of diode-laser bars and narrowing of bandwidth is required.

Wavelength stabilization and relative insensitivity of the emitting wavelength to temperature change has been achieved, in a single-mode laser diode, by locking the lasing wavelength to the reflecting wavelength of a wavelength selective reflector arranged to form an external cavity or resonator for the diode-laser. The wavelength selective reflector is provided by a fiber Bragg grating (FBG) formed on a length of a single-mode fiber. Single mode radiation from the diode-laser is launched into the core of the single mode fiber and is partially reflected and partially transmitted by the FBG. The FBG typically has a reflection coefficient between about 0.5% and 8% at a wavelength near the peak gain wavelength of the diode-laser and has a reflection bandwidth of about 1 nm or less. The reflected radiation wavelength is defined by the optical period (hereinafter simply "period") of the FBG. The emitting wavelength of the laser diode is locked to the peak reflection wavelength (resonance wavelength) of the FBG, and the emission bandwidth less than 1 nm. The resonance wavelength of an FBG is less sensitive to temperature change than the emitting wavelength of a (unstabilized) diode-laser. By way of comparison, the temperature sensitivity of the resonance wavelength for a FBG is about 0.01 nm/° K, while temperature sensitivity of lasing wavelength is about 0.3 nm/° K, as discussed above.

The FBG wavelength locking scheme is effective because the FBG is written in a single-mode fiber. In a single mode fiber, radiation is incident on the FBG at only one angle of incidence such that the wavelength of radiation reflected is determined only by the period of the FBG. Radiation from a multimode diode-laser must be coupled into a multimode fiber for efficient coupling. However, in a multimode fiber different modes propagate at different angles to the fiber axis. Were a FBG with fixed period written into such a multimode fiber, different lasing modes coupled into the fiber would be incident on the FBG at different angles, and, accordingly, would be reflected at different wavelengths. A result of this is that the output of the multimode diode-laser could not be locked to a single lasing wavelength. There is a need for a wavelength locking and stabilization scheme that is effective for a plurality of multimode diode-lasers the output of which is coupled into a plurality of multimode fibers.

SUMMARY OF THE INVENTION

The present invention is directed to a method and apparatus for stabilizing the lasing wavelength of a plurality of multimode diode-lasers. In one aspect, the inventive method comprises providing a wavelength selective reflecting device having a peak reflection wavelength within the emitting bandwidth of the diode-lasers. Light emitted by the plurality of diode-lasers is coupled into a single multimode optical fiber. Light from the multimode optical fiber is directed to the wavelength selective reflecting device. A portion of the light having the peak reflection wavelength is reflected from the wavelength selective reflecting device back along the multimode optical fiber and back into the plurality of diode-lasers, thereby locking the wavelength of the light emitted from each of the diode-lasers to the peak reflection wavelength.

The wavelength selective reflective devices suitable for use with the inventive method include a fiber Bragg grating and a volume Bragg grating (VBG). Preferably, the light from the multimode fiber is collimated prior to reflecting the light from the wavelength selective reflecting device. In a preferred embodiment of the inventive method, the light emitted from the plurality of diode-lasers is coupled into the multimode fiber via a corresponding plurality of other multimode fibers bundled and fused together, with the fused bundle being tapered to the diameter of the single optical fiber.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIG. 1 schematically illustrates one preferred embodiment of apparatus in accordance with the present invention including a plurality of multimode diode-lasers, an equal plurality of multimode optical fibers bundled, fused, and tapered into a common multimode optical fiber, an optical fiber collimator including a fiber Bragg grating, and a length of doped-core optical fiber coupled to the optical fiber collimator by a second common multimode fiber and arranged to function as an optical fiber-laser.

FIG. 2 schematically illustrates detail of the bundled and fused optical fibers in the apparatus of FIG. 1.

FIG. 3 is a cross-section view seen generally in a direction 3—3 of FIG. 1, schematically illustrating the details of a junction between the second common multimode optical fiber and the doped-core optical fiber of FIG. 1.

DETAILED DESCRIPTION OF THE INVENTION

Figure 4:
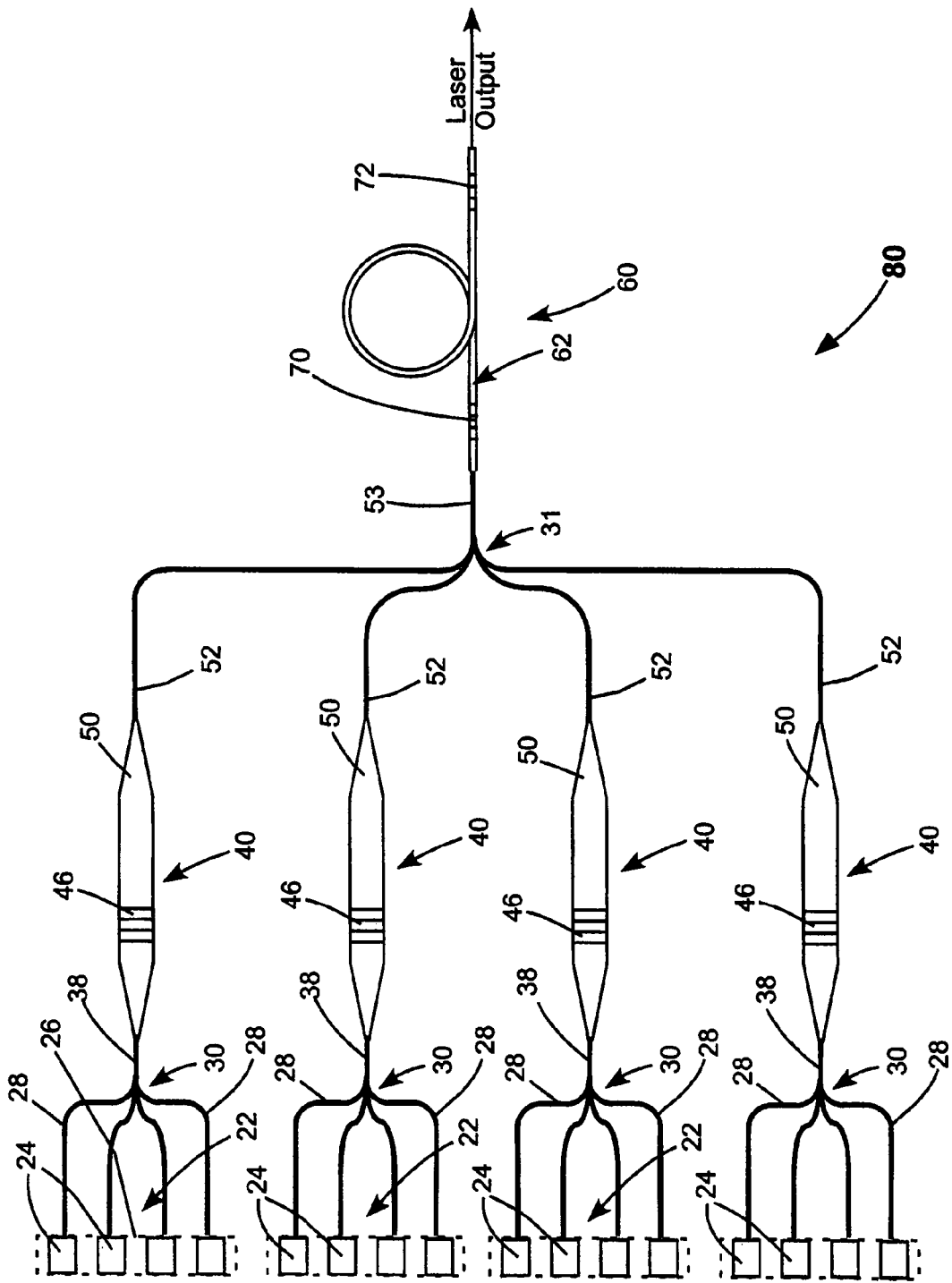
FIG. 4 schematically illustrates another preferred embodiment of apparatus in accordance with the present invention including four pluralities of multimode diode-lasers, and, for each of the pluralities of diode-lasers, an equal plurality of multimode optical fibers, each thereof bundled fused and tapered into a corresponding one of four first common multimode optical fibers, each of the first common multimode optical fibers coupled into a corresponding one of four optical fiber collimators each thereof including a fiber Bragg grating, the four collimators being coupled to a single second common multimode fiber, and a length of doped-core optical fiber coupled to the optical fiber collimators by the second common multimode fiber and arranged to provide an optical fiber-laser.

Referring now to the drawings, wherein like features are designated by like reference numerals, FIG. 1, FIG. 2, and FIG. 3 schematically illustrate one embodiment of a cladding pumped fiber-laser 20, optically pumped by a diode-laser array 22. Diode-laser array 22 is wavelength stabilized by a preferred embodiment of the wavelength stabilizing method of the present invention. Diode-laser array 22 includes a plurality of individual diode-lasers or emitters 24. These may be emitters in a diode-laser bar, indicated in phantom in FIG. 1 by dotted rectangle 26, or could be individual diode-lasers on separate substrates. A multimode optical fiber 28 is provided for each emitter 24. Light (not shown) emitted from each of the emitters 24 is coupled into a corresponding multimode fiber 28 as illustrated in FIG. 1. As methods for coupling light from a diode-laser array into a corresponding array of optical fibers are well known in the art to which the present invention pertains, a detailed description of such coupling is not presented herein. One suitable method is described in U.S. Pat. No. 5,949,932 the complete disclosure of which is hereby incorporated by reference.

Optical fibers 28 are collected into an optical fiber multiplexing arrangement (multiplexer) 30. Here, individual fibers 28 are grouped and fused together, in a fused region 32 (see FIG. 2) of the mutiplexer, such that there is no interstitial space between the optical fibers. Fused tapered region 32 is tapered to a smallest diameter about equal to the diameter of one of the individual fibers 28, providing a straight multimode fiber region 34 (see again FIG. 2) into which light from all of the fibers 28 is coupled by multiplexer 30. The multimode fiber region of multiplexer 30 is, here, extended by splicing a length of multimode fiber 38 onto the multiplexer as indicated by dashed line 36 in FIG. 1 and FIG. 2. Light exiting the multiplexer is coupled into multimode fiber 38. It should be noted, here, that a detailed description of the construction and operation of a multiplexer, such as multiplexer 30, is not necessary for understanding principles of the present invention. A detailed description of one such multiplexer is included in U.S. Pat. No. 5,864,644, the complete disclosure of which is hereby incorporated by reference.

Continuing with reference to FIG. 1, light coupled into multimode optical fiber 38 propagates therealong and is coupled into a fiber optic collimator 40. At one end of collimator 40 is an adiabatically up-tapered tapered region 42. Tapered region 42 has a smallest diameter thereof spliced to multimode optical fiber 28 as indicated in FIG. 1 by dashed line 48. Preferably, this narrowest diameter of tapered region 42 is about equal to the diameter of multimode fiber 38. Tapered region 42 tapers up in diameter from the smallest diameter to a largest diameter preferably between about two and five times this smallest diameter. Tapered region 42 then transitions to a straight region 44 having this largest diameter.

An optimum diameter of collimator 40 can be calculated using the Bragg reflection condition, the required bandwidth of light $\Delta\lambda$, fiber parameters, and brightness theorem. By way of example, for a required bandwidth of $\Delta\lambda=1$ nm at a central emitted wavelength of $\lambda=977$ nm, and for a multimode fiber 38 having core and cladding diameters of 400 and 440 microns, respectively, with a numerical aperture (NA) of 0.22, the core diameter $D_2$ of a straight region 44 can be calculated using the following equation:

$$D_2 = D_1 \cdot NA_1 \cdot \sqrt{\frac{\lambda}{2 \cdot \Delta\lambda \cdot n^2}} \quad (1)$$

where $D_1$ is the core diameter of fiber 38, $NA_1$ is the numerical aperture of the light in fiber 38, n is the refractive index of collimator 40. In one preferred example of fiber optic collimator 40, tapered region 42 has a length L between about 7.0 and 30.0 milllimeters (mm) providing smooth adiabatic up-taper from a fiber of 440 micron diameter to a fiber with 1480 micron diameter.

A FBG 46 is written into straight region 44 of collimator 40. FBG 46 has period selected such that the grating has a peak reflectivity for collimated light at a wavelength within the gain-bandwidth (emitting bandwidth) of emitters 24. Usually, such a grating would have a reflection bandwidth at half maximum reflection (FWHM) of less than 1.0 nm. As light propagates along tapered region 42 of collimator 40, different propagating angles of different modes with respect to the longitudinal axis of the collimator progressively decrease until, at the largest diameter of the collimator, in straight region 44 thereof, the angles of all of the modes are sufficiently close to parallel to the longitudinal fiber axis that light propagating in straight region 44 can be considered to be collimated. Accordingly, FBG 46 has about the same peak reflectivity wavelength for all modes. Preferably, this peak reflectivity is between about 0.5% and 50%.

Light reflected from FBG 46 is directed back through tapered region 42 of collimator 40. On propagating back through tapered region 40, the propagating angles of the different modes increase and become characteristically different, however, all of these back reflected modes have the same wavelength. The back reflected light propagates along multimode fiber 38 back to multiplexer 30. In multiplexer 30, the back reflected light is distributed back into individual multimode fibers 28 and is fed back into each of emitters 24. This locks the emitting wavelength of all of the emitters at the peak reflection wavelength of FBG 46 and constrains the emitting bandwidth to about the bandwidth of FBG.

It should be noted, here, that while FBG 46 essentially forms an external (feedback) resonator for each emitter 24, it is not necessary that the optical path lengths from the grating to the emitters be equal, provided that this path is longer than about 0.5 meters (m). In this case, there will be sufficient individual lasing modes in the each individual external resonator within the reflection bandwidth of FBG 46 that the emitting wavelength of all of the emitters 24 will be locked to about the same wavelength.

Continuing now with reference to FIG. 1 and additionally to FIG. 3, optical fiber collimator 40 includes a second down-tapered region 50 having a diameter tapering from the diameter of straight region 44 of the collimator to a lesser diameter about equal to the diameter of a multimode optical fiber 52. Fiber 52 has a multimode core 54 surrounded by cladding 56 (see FIG. 3). Tapered region 50 of the collimator is coupled to optical fiber 52 by a splice joint indicated in FIG. 1 by dashed line 58. Light propagates through straight region 44 of optical fiber collimator 40 and is concentrated by tapered region 50 before being coupled into multimode optical fiber 52. Light propagates in core 54 of multimode fiber 52.

A fiber-laser 60 includes a single mode fiber 62 having a doped core 64 surrounded by inner cladding 66, which is, in turn, surrounded by outer cladding 68 (see FIG. 3). It should be noted, here, that in FIG. 3, a longitudinal cross section view of fiber 62, traditional cross-hatching of material is omitted for clarity. Multimode optical fiber 52 preferably has a diameter about equal to single-mode optical fiber 62 and is coupled thereto via a splice joint indicated in FIGS. 1 and 3 by a dashed line 58. Light propagating in multimode optical fiber 52 is coupled into single-mode optical fiber 62 and propagates primarily in inner cladding 66 thereof, progressively being absorbed in doped, single-mode core 64. As a result of this, the propagating light provides pump-light for fiber-laser 60. FBGs 70 and 72 written into ends regions 60A and 60B respectively of optical fiber 62, each being selectively reflective at the lasing wavelength of the optical fiber define a resonator for fiber-laser 60. Laser output is delivered from free end 62B of optical fiber 62.

Although FIG. 3 illustrates the more conventional arrangement where the doped core 64 is located in the center of the fiber, other arrangements are possible. For example, the doped core can be in the form of an annular with the central region of the fiber being undoped as described in U.S. Pat. No. 6,288,835, the disclosure of which is incorporated herein by reference.

FIG. 4 schematically illustrates another embodiment 80 of a cladding pumped fiber-laser, optically pumped by a plurality of diode-laser arrays 22, each of the arrays being wavelength stabilized by the wavelength stabilizing method of the present invention. In laser 80 there are four diode-laser arrays 22 each thereof including a plurality of emitters 24. There are four fiber optic collimators 40, one for each of the diode-laser arrays. Light from the plurality of emitters 24 in each array is coupled via a plurality of multimode fibers 28 and one of four multiplexers 30 into one of four multimode optical fibers 38. Light from each of the multimode fibers 38 is coupled into a corresponding one of the fiber optic collimators 40. Each of the fiber optic collimators 40 has a FBG 46 written into straight region 44 thereof. Light having the peak reflection wavelength of the FBG is reflected back into emitters 24 of the diode-laser array thereby locking the emitting wavelength of those emitters to the peak reflection wavelength of the FBG.

In each fiber optic collimator 40, light not reflected back from the FBG propagates through straight region 44 of the collimator, is concentrated in down-tapered region 50 of the collimator then coupled into one of four multimode optical fibers 52. Light from the four multimode fibers 52 is coupled via a multiplexer 31 into a single multimode optical fiber 53. Light from multimode fiber 53 is coupled into single mode fiber 62 of a fiber-laser 60 for pumping the fiber-laser, as discussed above.

Figure 5:
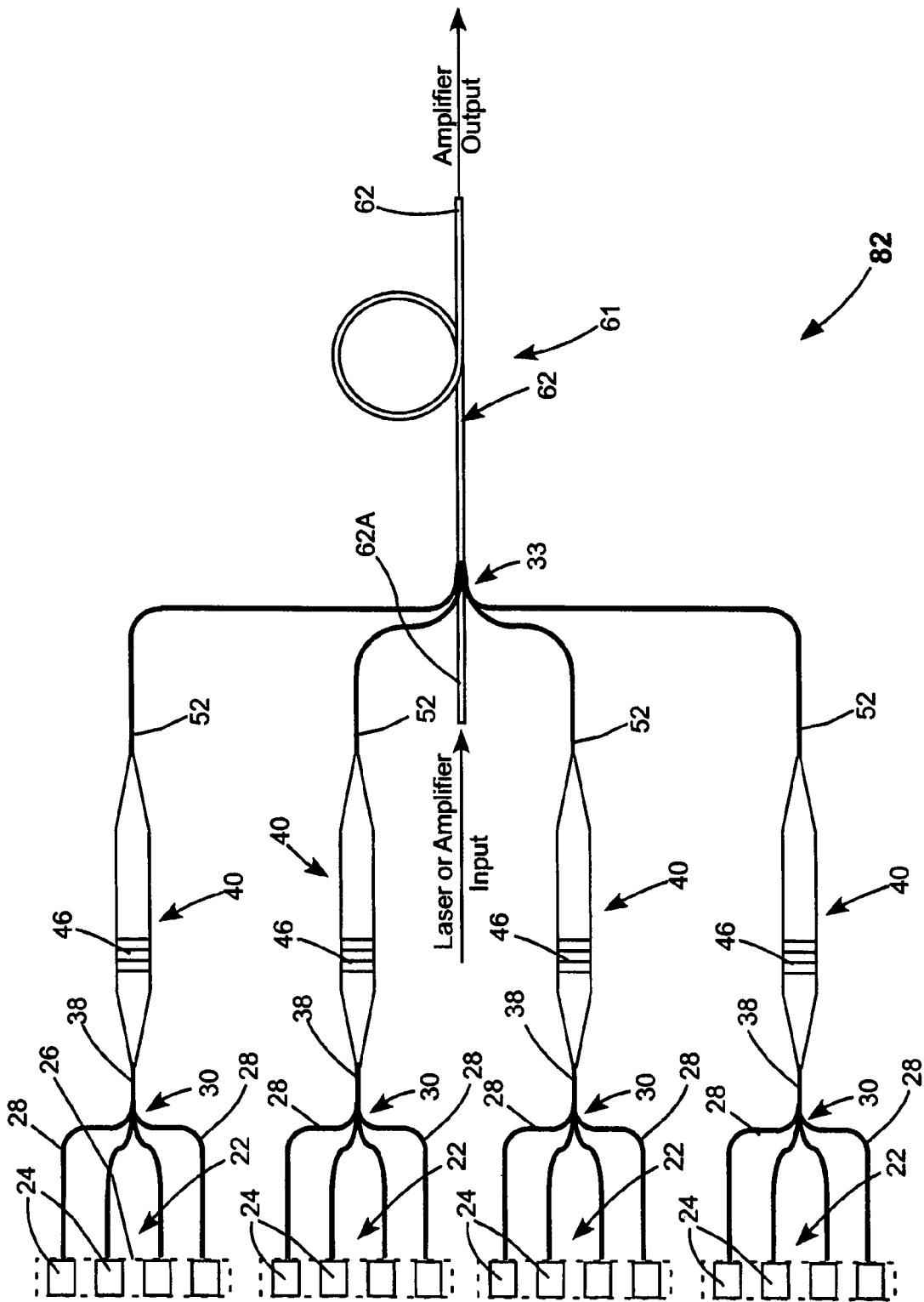
FIG. 5 schematically illustrates yet another preferred embodiment of apparatus in accordance with the present invention including four pluralities of multimode diode-lasers, and, for each of the pluralities of diode-lasers, an equal plurality of multimode optical fibers each thereof bundled fused and tapered into a corresponding one of four first common multimode optical fibers, each of the first common multimode optical fibers coupled into a corresponding one of four optical fiber collimators each thereof including a fiber Bragg grating, and a length of doped-core optical fiber coupled to the four optical fiber collimators by a corresponding four second common multimode optical fibers.

FIG. 5 schematically illustrates one embodiment of a cladding pumped fiber amplifier 80 optically pumped by a plurality of diode-laser arrays 22, each one the arrays being wavelength stabilized by the wavelength stabilizing method of the present invention. In fiber amplifier 82 there are four diode-laser arrays 22 each thereof including a plurality of emitters 24 as described above with reference to laser 80. Light from the plurality of emitters 24 in each array is coupled via a plurality of multimode fibers 28 and one of four multiplexers 30 into one of four multimode optical fibers 38. Light from each of the multimode fibers 38 is coupled into a corresponding one of four fiber optic collimators 40. Each of the fiber optic collimators 40 has a FBG 46 written into straight region 44 thereof. Light having the peak reflection wavelength of the FBG is reflected back into emitters 24 of the diode-laser array, thereby locking the emitting wavelength of those emitters to the peak reflection wavelength of the FBG.

In each fiber optic collimator 40, light that is not reflected back from the FBG propagates through straight region 44 of the collimator, is concentrated in down-tapered region 50 of the collimator, then coupled into one of four multimode optical fibers 52. Light from the four multimode fibers 52 is coupled into inner the cladding of a single multimode optical fiber 62 for energizing the doped core of the fiber-laser. Light to be amplified, for example, from a laser or from another amplifier, is coupled into end 62A of optical fiber 62. Amplified light is delivered from end 62B of optical fiber 62. The coupling, here, is effected by grouping multimode fibers 52 around single-mode fiber in an arrangement 33. Each of the multimode fibers 52 is tapered and fused into the cladding of the single-mode fiber. This mode of coupling light from multimode fibers 52 into single-mode fiber 62, however, should not be construed as limiting. Any other coupling arrangement known in the art may be used without departing from the spirit and scope of the present invention.

Figure 6:
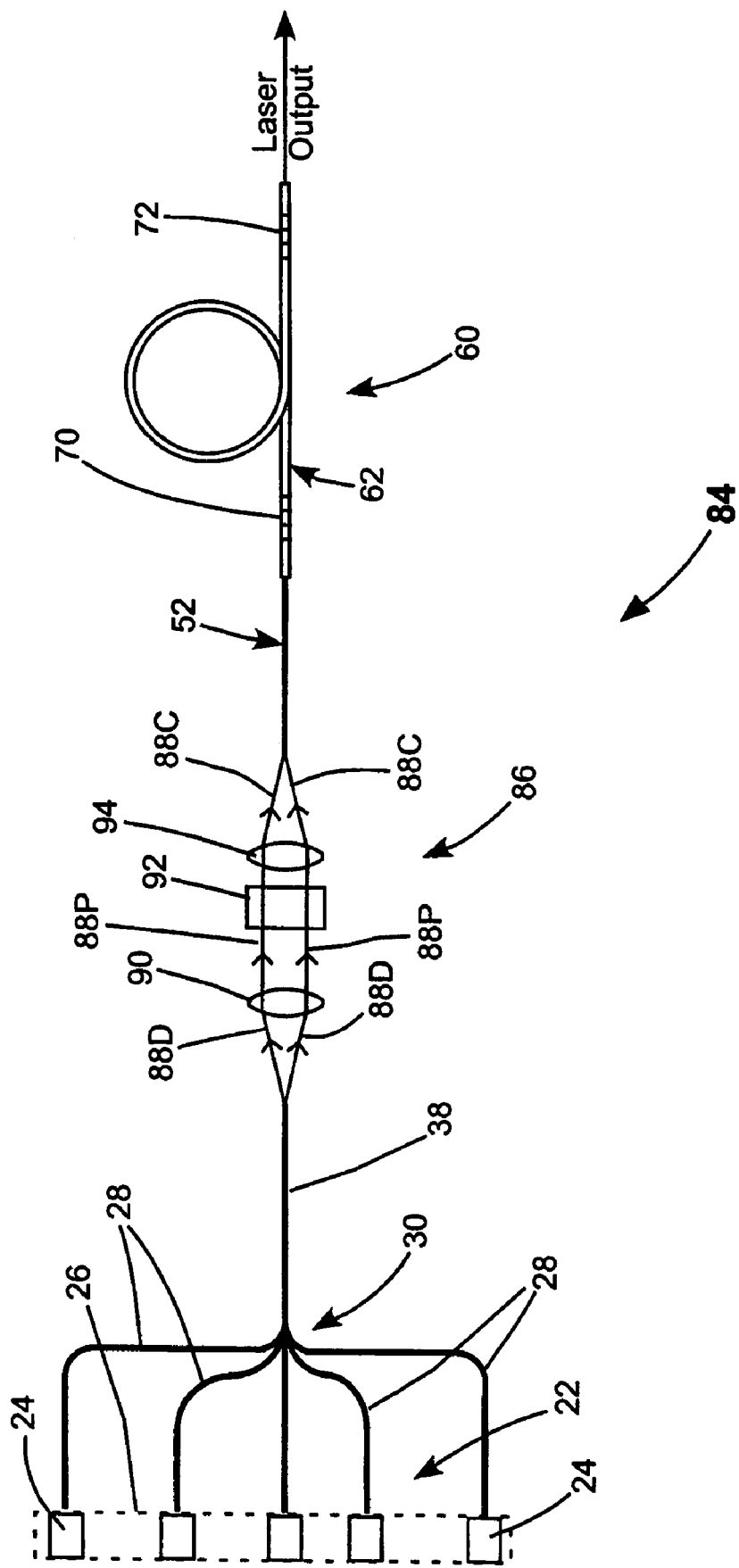
FIG. 6 schematically illustrates still another preferred embodiment of apparatus in accordance with the present invention including a plurality of multimode diode-lasers, an equal plurality of multimode optical fibers bundled fused and tapered into a common multimode optical fiber, a collimating lens for collimating light from the common optical fiber, and a volume Bragg grating positioned to receive light from the collimating lens.

FIG. 6 schematically illustrates yet another embodiment 84 of a cladding pumped fiber-laser optically pumped by a diode-laser arrays 22 including a plurality of emitters 24. Laser 84 is similar to above-described laser 20 of FIG. 1, with an exception that a bulk optics arrangement 86 is used for collimation and back reflection of light, in place of a fiber optic collimator and FBG. Light from the plurality of emitters 24 is coupled via a corresponding plurality of multimode optical fibers 28 into a single multimode optical fiber 38. Light is delivered from end 38E of optical fiber 38 as a diverging bundle of rays designated in FIG. 6 by rays 88D. Ray 88D are received by a positive lens 90 and collimated as indicated by parallel rays 88P. Parallel rays 88 traverse a volume Bragg grating (VBG) 92. VBG 92 has a period selected such that the grating has a peak reflectivity for collimated light at a wavelength within the gain-bandwidth (emitting bandwidth) of emitters 24. The peak reflectivity is preferably between about 0.5% and 50% as discussed above for FBG 46.

Light reflected from VBG 92 is coupled back into multimode optical fiber 38 by lens 90 and propagates back along multimode fiber 38 to multiplexer 30. In multiplexer 30 the back reflected light is distributed back into individual multimode fibers 28 and is fed back into each of emitters 24. This locks the emitting wavelength of all of the emitters at the peak reflection wavelength of FBG 46. Light that is not reflected by VBG 92 is collected by a lens 90 and coupled into multimode optical fiber 52 as indicated by converging rays 86C. Light is then coupled from optical fiber 52 into fiber-laser 60 as described above with reference to laser 20 of FIG. 1.

It should be noted here that, in theory at least, VBG 92 could be replaced by a vacuum-deposited multilayer reflector having a comparable reflection bandwidth, for example, a bandwidth of about 0.1% of the nominal wavelength of light to be reflected. Fabricating such a reflector, however, would require deposition of hundreds of layers even for the relatively low reflectivity required. Further, thickness and refractive index of the layers would need to be extremely precisely controlled, for example, to within about 0.1%, to limit the occurrence of unwanted sideband reflections. It is believed that depositing such a reflector is not practical within the scope of present vacuum technology.

The present invention is discussed above in terms of a preferred and other embodiments. The invention is not limited, however, to the embodiments described and depicted. Rather the invention is limited only by the claims appended hereto.

What is claimed is:

1. A method of stabilizing the wavelength of light emitted by each one of a plurality of multimode diode-lasers, each of said diode-lasers having an emitting bandwidth, the method comprising the steps of:
   providing a wavelength selective reflecting device having a peak reflection wavelength within the emitting bandwidth of the diode-lasers;
   coupling the light emitted from the plurality of diode-lasers into a first multimode optical fiber;
   directing said light from said first multimode optical fiber onto said wavelength selective reflecting device; and
   reflecting a portion said light having said peak reflection wavelength from said wavelength selective reflecting device back along said first multimode optical fiber and back into said diode-lasers thereby locking the wavelength of the light emitted from said diode-lasers to said peak reflection wavelength.

2. The method of claim 1, wherein said wavelength selective reflective device is a FBG.

3. The method of claim 1, wherein said wavelength selective reflecting device is a volume Bragg grating.

4. The method of claim 1, wherein said wavelength selective reflecting device has a bandwidth less than about 1 nanometer and a reflectivity between about 0.5% and 50%.

5. The method of claim 1 further including the step of collimating said light from said first multimode optical fiber prior to said reflecting step.

6. The method of claim 1, wherein the light emitted from each of the plurality of diode-lasers is coupled into said first multimode optical fiber via a corresponding plurality of second multimode optical fibers.

7. A method of stabilizing the wavelength of light emitted by each one of a plurality of multimode diode-lasers, each of said diode-lasers having an emitting bandwidth, the method comprising the steps of:
   coupling the light emitted from the plurality of diode-lasers into a first multimode optical fiber;
   coupling said light from said multimode optical fiber into an optical fiber collimator, said optical fiber collimator including a fiber Bragg grating having a peak reflection wavelength within said emitting bandwidth; and
   reflecting a portion of said light having said peak wavelength from said fiber Bragg grating back into said diode-lasers thereby locking the wavelength of the light emitted from said diode-lasers to said peak reflection wavelength.

8. The method of claim 7, wherein said first multimode optical fiber has a first diameter and said optical fiber collimator has a diameter tapered at one end thereof from said first diameter to a second diameter greater than said first diameter, said first diameter of said tapered region being coupled to said first multimode optical fiber.

9. The method of claim 8 wherein said optical fiber collimator has a straight region following said tapered region, said straight region of said optical fiber collimator having said second diameter and including said fiber Bragg grating.

10. The method of claim 7, wherein the light emitted from each of the plurality of diode-lasers is coupled into said first multimode optical fiber via a corresponding plurality of second multimode optical fibers.

11. The method of claim 7, further including the steps of providing a single mode optical fiber including a single mode doped-core surrounded by a cladding, and coupling said light from said optical fiber collimator into said cladding of said single-mode optical fiber.

12. A method of stabilizing the wavelength of light emitted from each of a plurality of multimode diode-lasers, each of said diode-lasers having an emitting bandwidth, the method comprising the steps of:
providing a plurality of first multimode optical fibers equal in number to the plurality of diode-lasers;
coupling the light emitted from each of the plurality of diode-lasers into a corresponding one of the multimode optical fibers;
coupling the light from the plurality of multimode fibers into a single second multimode optical fiber;
coupling the light from the second multimode optical fiber into an optical fiber collimator, said optical fiber collimator including a fiber Bragg grating having a peak reflection wavelength within said emitting bandwidth; and
reflecting a portion said light having said peak wavelength from said fiber Bragg grating back along said second and first optical fibers into said diode-lasers thereby locking the wavelength of the light emitted from said diode-lasers to said peak reflection wavelength.

13. The method of claim 12 wherein said optical fiber collimator has a straight region following a tapered region, said straight region of said optical fiber collimator having said second diameter and including said fiber Bragg grating.

14. The method of claim 12, further including the steps of providing a single mode optical fiber including a single mode doped-core surrounded by a cladding, and coupling said light from said optical fiber collimator into said cladding of said single-mode optical fiber.

15. The method of claim 14, wherein said light is coupled from said optical fiber collimator into said cladding of said single-mode optical fiber via a third multimode optical fiber.

16. A method of stabilizing the wavelength of light emitted by each of a plurality of multimode diode-lasers, each of said diode-lasers having an emitting bandwidth, the method comprising the steps of:
providing a wavelength selective reflecting device having a peak reflection wavelength within said emitting bandwidth;
coupling the light emitted from the plurality of diode-lasers into a first multimode optical fiber;
emitting said light from said multimode optical fiber;
collimating said light emitted from said multimode optical fiber; and
reflecting a portion of said collimated light having said peak wavelength from wavelength selective reflecting device, via said collimating lens and said first multimode optical fiber, back into said diode-lasers, thereby locking the wavelength of the light emitted from said diode-lasers to said peak reflection wavelength.

17. The method of claim 16, wherein said wavelength selective reflecting device is a volume Bragg grating.

18. A laser, comprising:
a single-mode optical fiber having a single-mode doped core surrounded by a cladding, said doped core providing a gain-medium for the laser;
a plurality of diode-lasers, each of said diode-lasers emitting light having a wavelength within an emitting bandwidth;
a wavelength selective reflecting device having a peak reflection wavelength within the emitting bandwidth of the diode-lasers;
an optical arrangement for coupling the light emitted from the plurality of diode-lasers into a first multimode optical fiber;
an optical arrangement for directing said light from said multimode optical fiber onto said wavelength selective reflecting device, said directing arrangement configured such that a portion said directed light having said peak reflection wavelength is reflected from said wavelength selective reflecting device back along said first multimode optical fiber and back into said diode-lasers, thereby locking the wavelength of the light emitted from said diode-lasers to said peak reflection wavelength; and
an optical arrangement for coupling a portion of said light from said multimode fiber light not reflected from said wavelength selective reflecting device into said cladding of said single-mode optical fiber.

19. A light source comprising:
a plurality of diode-lasers, each of said diode-lasers emitting light having a wavelength within an emitting bandwidth;
a plurality of optical fibers with the input ends of the fibers being in optical communication with individual ones of said diode lasers and the output ends thereof being fused to form a common output; and
a fiber optic collimator having an input end optically communicating with the common output from the optical fibers, said collimator including a grating configured to have a peak reflection wavelength within the emitting bandwidth of the diode-lasers whereby a portion of the light entering the collimator is reflected back into the respective diode-lasers for locking the emitted wavelength thereof while the remainder of the light entering the collimator exits the collimator at an output end thereof.

20. A light source as recited in claim 19 wherein said grating has a bandwidth less than about 1 nanometer and a reflectivity between about 0.5% and 50%.

21. A light source as recited in claim 20 utilized to pump a fiber laser.

22. A light source as recited in claim 20 utilized to pump a fiber amplifier.

* * * * *